(12) United States Patent
Hatase et al.

(10) Patent No.: US 11,049,831 B2
(45) Date of Patent: Jun. 29, 2021

(54) CIRCUIT SUBSTRATE

(71) Applicant: Murata Manufacturing Co., Ltd., Nagaokakyo (JP)

(72) Inventors: Minoru Hatase, Nagaokakyo (JP); Masaaki Mizushiro, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 63 days.

(21) Appl. No.: 16/550,402

(22) Filed: Aug. 26, 2019

(65) Prior Publication Data

US 2019/0378808 A1    Dec. 12, 2019

Related U.S. Application Data

(63) Continuation of application No. PCT/JP2018/006571, filed on Feb. 22, 2018.

(30) Foreign Application Priority Data

Mar. 3, 2017 (JP) .............................. JP2017-040358

(51) Int. Cl.
*H01L 23/00* (2006.01)
*H01L 21/48* (2006.01)
*H01L 23/498* (2006.01)

(52) U.S. Cl.
CPC .......... *H01L 24/16* (2013.01); *H01L 21/4853* (2013.01); *H01L 23/49838* (2013.01); *H01L 23/49894* (2013.01); *H01L 2224/10175* (2013.01); *H01L 2224/16227* (2013.01); *H01L 2924/01028* (2013.01); *H01L 2924/01029* (2013.01); *H01L 2924/01079* (2013.01)

(58) Field of Classification Search
CPC ................. H01L 24/16; H01L 21/4853; H01L 23/49838
See application file for complete search history.

(56) References Cited

U.S. PATENT DOCUMENTS 6,387,793 B1 * 5/2002 Yap .......................... H01L 24/11
257/E21.508

FOREIGN PATENT DOCUMENTS

JP    2001053111 A    2/2001
JP    2001102733 A    4/2001
(Continued)

OTHER PUBLICATIONS

International Search Report issued in PCT/JP2018/006571, dated May 15, 2018.
(Continued)

*Primary Examiner* — Errol V Fernandes
(74) *Attorney, Agent, or Firm* — Arent Fox LLP

(57) ABSTRACT

A circuit substrate that includes a substrate having a major surface, a multilayer body on the major surface, and an insulating layer that covers the major surface. The multilayer body includes a first layer and a second layer that overlies the first layer. The first layer is made of a first metal as a main material thereof, and the second layer is made of a second metal as a main material thereof. The second metal has a higher solder wettability than the first metal. As viewed perpendicular to the major surface, the insulating layer is spaced from and surrounds the surface of the second layer so as to define a recess between the multilayer body and the insulating layer.

13 Claims, 5 Drawing Sheets

(56) References Cited

FOREIGN PATENT DOCUMENTS

| JP | 2004071898 A | | 3/2004 |
|---|---|---|---|
| JP | 2006287148 A | * | 10/2006 |
| JP | 2006287148 A | | 10/2006 |
| JP | 2008244186 A | | 10/2008 |
| JP | 2011044734 A | * | 3/2011 |
| JP | 2011044734 A | | 3/2011 |
| JP | 2013080841 A | | 5/2013 |
| JP | 2016127066 A | | 7/2016 |

OTHER PUBLICATIONS

Written Opinion of the International Searching Authority issued in PCT/JP2018/006571, dated May 15, 2018.

* cited by examiner

CIRCUIT SUBSTRATE

CROSS REFERENCE TO RELATED APPLICATIONS

The present application is a continuation of International application No. PCT/JP2018/006571, filed Feb. 22, 2018, which claims priority to Japanese Patent Application No. 2017-040358, filed Mar. 3, 2017, the entire contents of each of which are incorporated herein by reference.

FIELD OF THE INVENTION

The present invention relates to a circuit substrate.

BACKGROUND OF THE INVENTION

A mounting structure is disclosed in Japanese Unexamined Patent Application Publication No. 2001-53111 (Patent Document 1). In this mounting structure, grooves are formed in a mounting substrate. When a semiconductor element is mounted on the mounting substrate with solder bumps interposed therebetween, an excess portion of solder is expected to flow out from electrodes of the substrate into the grooves.

SUMMARY OF THE INVENTION

In the Patent Document 1, although the mounting substrate includes the grooves formed thereon, the inner surface of each groove is not formed of a material having a wettability of solder. Accordingly, when the amount of solder varies, it is difficult to adjust an amount of solder flowing into the groove. As a result, the amount of solder remaining on the top surface of each electrode of the substrate still varies and does not stay in a desired range.

Accordingly, an object of the invention is to provide a circuit substrate that can reduce variation in the amount of solder remaining on the top surface of an electrode.

The present invention provides a circuit substrate that includes a substrate having a major surface, a multilayer body on the major surface, and an insulating layer on the major surface. The insulating layer is spaced from and surrounds the multilayer body as viewed perpendicular to the major surface. The multilayer body includes a first layer made of a first metal as a main material thereof and a second layer made of a second metal as a main material thereof. The second layer overlies the first layer, and the second metal has a higher solder wettability than the first metal. In the circuit substrate, the insulating layer defines a recess between the multilayer body and the insulating layer. In addition, at least a surface of first layer of the multilayer body is covered with an antioxidant film.

According to the present invention, since the wettability of the solder is different between the first layer and the second layer, the amount of solder thereby determines how far the molten solder enters the recess, which can thereby reduce variations in the amount of solder remaining on the top surface of the multilayer body or the electrode.

DETAILED DESCRIPTION OF THE PREFERRED EMBODIMENTS

Figure 1:
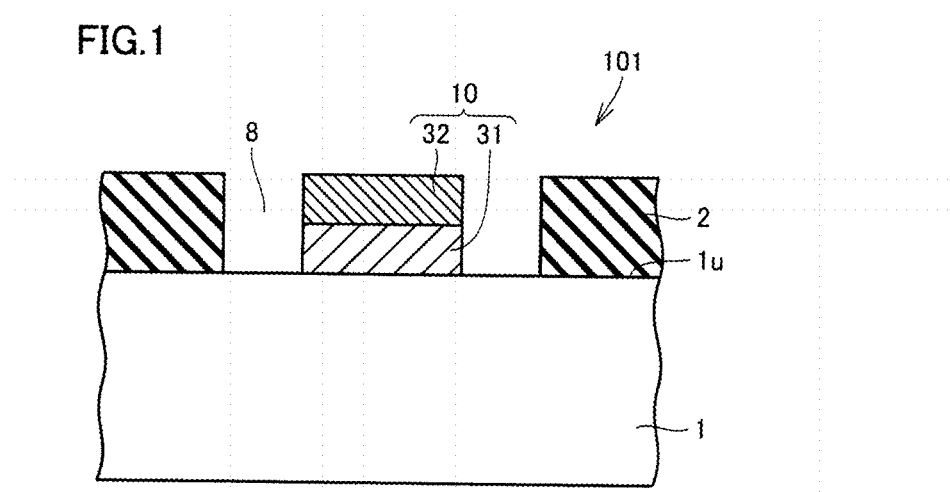
FIG. 1 is a partial cross-sectional view illustrating a circuit substrate according to a first embodiment of the present invention.

Dimensions in the drawings do not necessarily reflect actual dimensional relationships and may be exaggerated for the convenience of explanation. Terms related to "up" and "down" or "above" and "below" in the following description may not always be used in their absolute senses but may be used relatively with respect to illustrated positions.

First Embodiment

A circuit substrate according to a first embodiment of the present invention will be described with reference to FIG. 1.

As illustrated in FIG. 1, a circuit substrate 101 according to the present embodiment includes a substrate 1 having a major surface 1u, a multilayer body 10 disposed on the major surface 1u, and an insulating layer 2 that covers the major surface 1u. The multilayer body 10 is an electrode. The multilayer body 10 includes a first layer 31 on the substrate and a second layer 32 that overlies the first layer 31. The first layer 31 is made of a first metal as a main material thereof, and the second layer 32 is made of a second metal as a main material thereof. The second metal has a higher solder wettability than the first metal. As viewed perpendicular to the major surface 1u (i.e., a plan view from the major surface 1u), the insulating layer 2 is disposed so as to be spaced from the surface of the second layer 32 and to surround the second layer 32. In the illustrated example, when viewed perpendicular to the major surface 1u, the insulating layer 2 is disposed so as to be spaced from the multilayer body 10 and to surround the multilayer body 10. The first metal may be, for example, Cu. The second metal may be, for example, Au. A recess 8 is defined by, and formed between, the multilayer body 10 and the insulating layer 2. As viewed from above, the recess 8 is formed so as to surround the multilayer body 10. The insulating layer 2 may be a layer formed of a solder resist.

As viewed perpendicular to the major surface 1u, each side surface of the first layer 31 is preferably located at the same position as a corresponding side surface of the second layer 32. In other words, it is preferable that the second layer 32 do not cover the side surfaces of the first layer 31. As illustrated in FIG. 1, each side surface of the first layer 31 is preferably flush with the corresponding side surface of the second layer 32.

Figure 2:
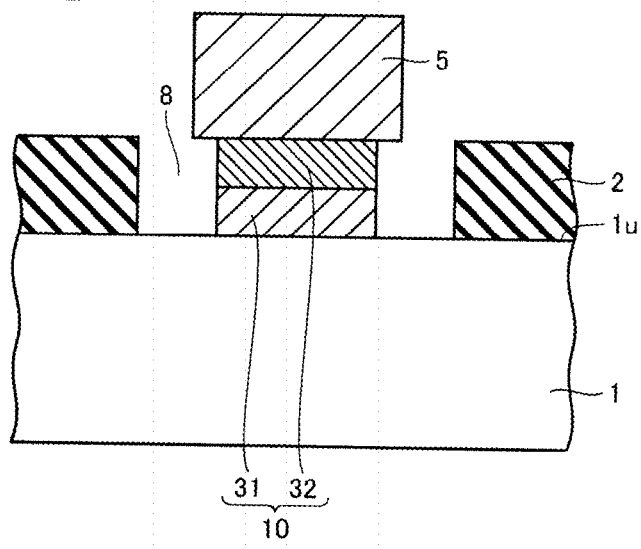
FIG. 2 is a partial cross-sectional view illustrating a state in which solder is placed on an electrode of the circuit substrate according to the first embodiment of the present invention.
Figure 3:
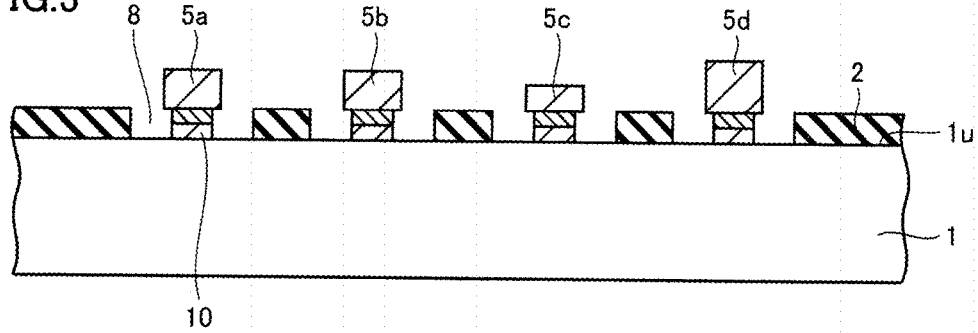
FIG. 3 is a partial cross-sectional view illustrating a state in which solder is placed on multiple electrodes of the circuit substrate according to the first embodiment of the present invention.
Figure 4:
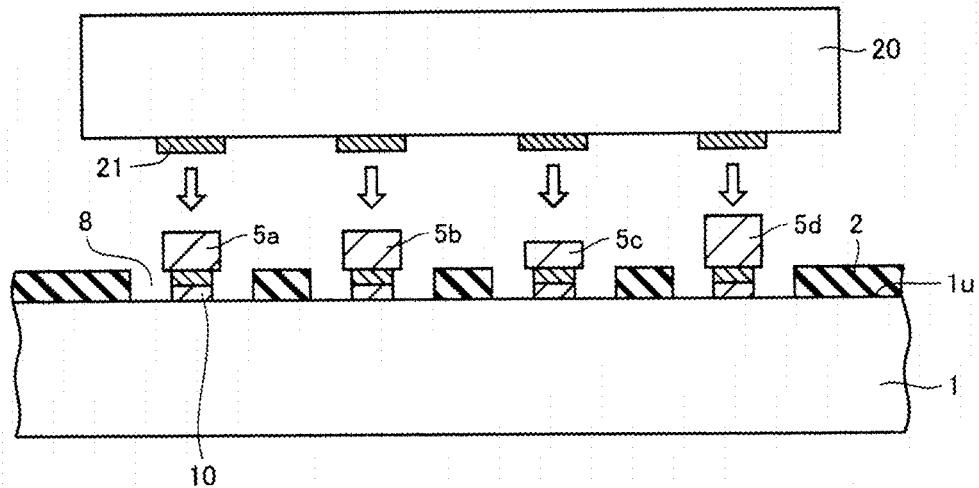
FIG. 4 is a view illustrating a state in which a component is being mounted on the circuit substrate according to the first embodiment of the present invention.
Figure 5:
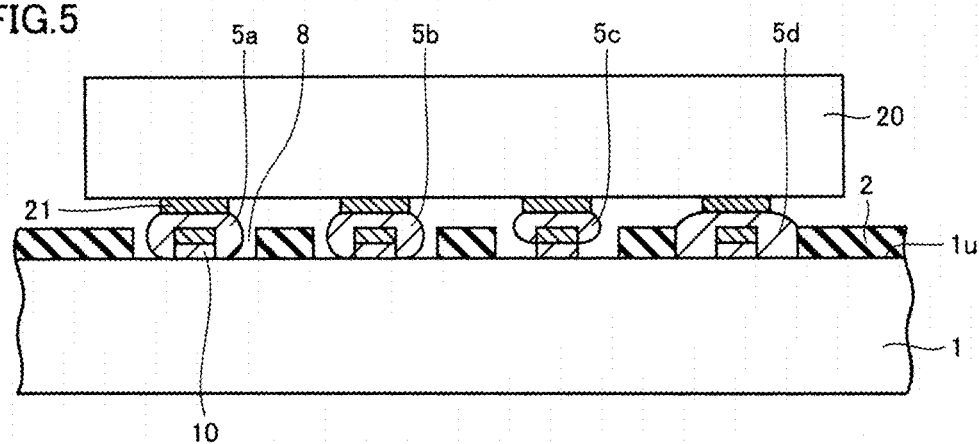
FIG. 5 is a view illustrating behavior of solder when the component is mounted on the circuit substrate according to the first embodiment of the present invention.

The second metal has been described as having a higher solder wettability than the first metal. Here, wettability or spreadability of solder is to be determined by using the spread rate $S_R$ defined in the Japanese Industrial Standard (JIS Z 3198). The testing procedure is also prescribed in JIS Z 3198. In accordance with this testing procedure, the spread rate $S_R$ is obtained from the following equation:

Spread Rate $S_R(\%)=\{(D-H)/D\}\times 100$ where each parameter is defined as follows:
H: height (mm) of solder after testing
D: diameter (mm) of solder before testing when the solder is assumed to be a sphere
=$1.24V^{1/3}$
V: mass/density of a solder sample used in the test In the circuit substrate 101 according to the present embodiment, the multilayer body 10 serves as an electrode, and electrical connection is achieved by soldering. As illustrated in FIG. 2, solder 5 is disposed on the top surface of the multilayer body 10. FIG. 3 provides a wider view by way of example. In this example, solders 5a, 5b, 5c, and 5d are disposed on four multilayer bodies 10, respectively. Solders 5a, 5b, 5c, and 5d vary in amount. Subsequently, a component 20 is placed thereon as illustrated in FIG. 4. The component 20 has component-side electrodes 21 on the bottom surface thereof. The solders 5a, 5b, 5c, and 5d melt by heating, which leads to a state illustrated in FIG. 5. The solders 5a, 5b, 5c, and 5d are pressed by the component 20, squeezed out laterally, and enter the recess 8. However, as illustrated in FIG. 5, the solders 5a, 5b, 5c, and 5d spread out differently due to variation in the solder amount. The multilayer body 10 includes a first layer 31 made of a first metal as a main material and a second layer 32 made of a second metal as a main material, and the second layer 32 overlies the first layer 31. The second metal has a higher solder wettability than the first metal. Accordingly, the spreading manner of solder depends on the amount of the solder. The solder does not always flow into the bottom of the recess 8 but may stop at the side surfaces of the second layer 32 and adhere thereto if the amount of the solder is such. The solder reaches the side surfaces of the first layer 31 only when the amount of the solder is such that the solder cannot stop at the side surfaces of the second layer 32.

Describing specifically with reference to the drawings, when the amount of solder is small, the solder reaches the side surfaces of the second layer 32 but does not reach the side surfaces of the first layer 31 as is the case of the solder 5c in FIG. 5. When the amount of solder is large, the solder cannot stop at the side surfaces of the second layer 32 and reaches the side surfaces of the first layer 31. When the amount of solder is moderate, the solder extends so as to cover the side surfaces of both second and first layers 32 and 31 as are the cases of the solders 5a and 5b in FIG. 5. In this case, the solder does not reach the bottom surface of the recess 8. When the amount of solder is more than this, the solder spreads so as to not only cover the side surfaces of the second layer 32 and the first layer 31 but also reach the bottom surface of the recess 8 as is the case of the solder 5d in FIG. 5.

In the circuit substrate 101 according to the present embodiment, the wettability of the solder is made different between the first layer 31 and the second layer 32. The amount of solder thereby determines how far the molten solder enters the recess 8. The solder pressed out of the top surface of the electrode enters the recess 8, which enables the amount of solder remaining on the top surface to be substantially constant. In the example illustrated in FIG. 5, in spite of variation in the amount of solder disposed on each of the four electrodes, the final amount of solder remaining on the top surface of each electrode becomes substantially the same.

Thus, with this embodiment, the variation of solder amount remaining on the top surface of each electrode can be reduced.

Second Embodiment

Figure 6:
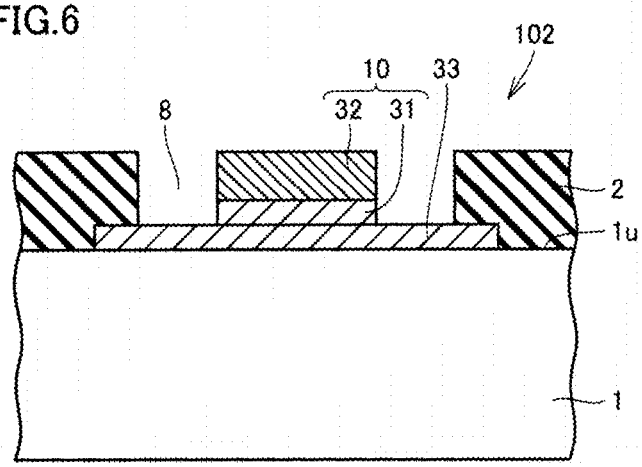
FIG. 6 is a partial cross-sectional view illustrating a circuit substrate according to a second embodiment of the present invention.

A circuit substrate according to a second embodiment of the present invention will be described with reference to FIG. 6.

A circuit substrate 102 according to the present embodiment is similar in basic configuration to the circuit substrate 101 described in relation to the first embodiment except for the following points. As illustrated in FIG. 6, the circuit substrate 102 according to the present embodiment further includes a third layer 33 that is made of the first metal as a main material and disposed at the bottom of the recess 8. In the case of the recess 8 having a flat bottom surface, the bottom of the recess 8 may be the bottom surface thereof. However, the recess 8 may not always have a flat bottom surface. If the recess 8 does not have the flat bottom surface, the bottom of the recess 8 is defined as a region near the lowest point on the inner surface of the recess 8.

Figure 7:
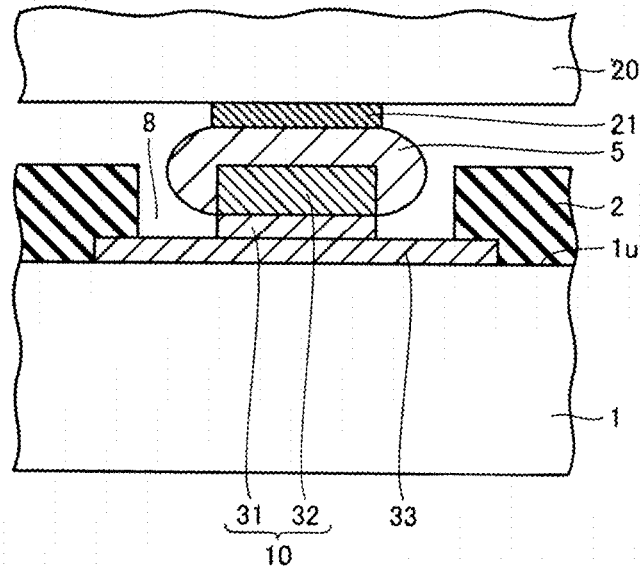
FIG. 7 is a view illustrating a first example when solder is disposed on each electrode of the circuit substrate according to the second embodiment of the present invention and the component is mounted on the circuit substrate.
Figure 8:
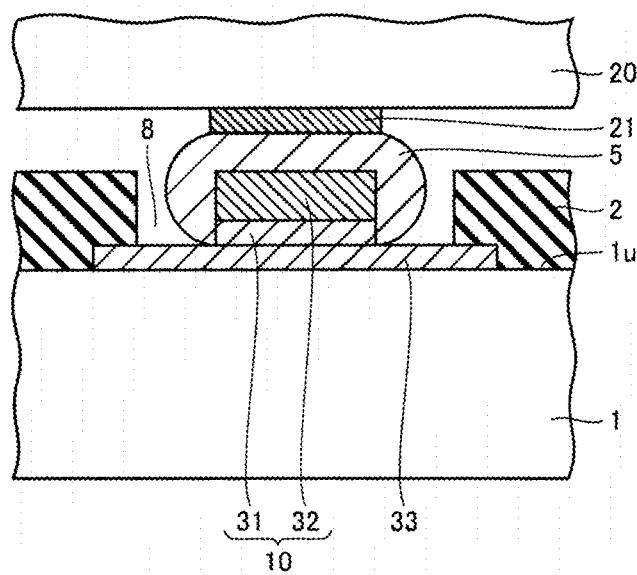
FIG. 8 is a view illustrating a second example when solder is disposed on each electrode of the circuit substrate according to the second embodiment of the present invention and the component is mounted on the circuit substrate.
Figure 9:
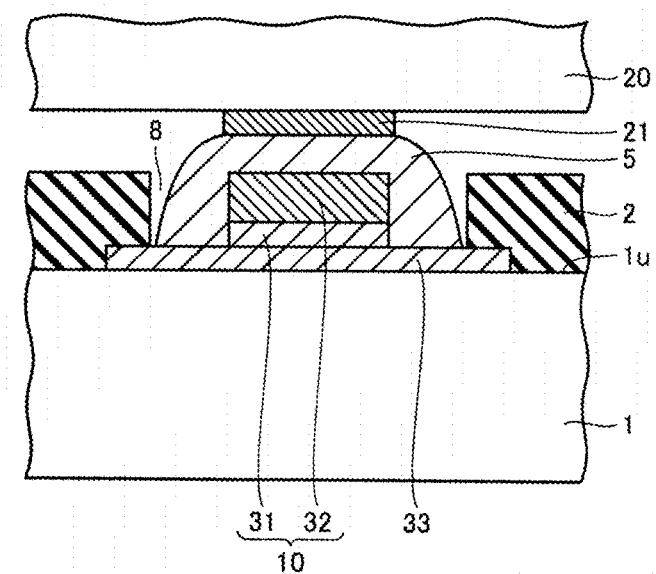
FIG. 9 is a view illustrating a third example when solder is disposed on each electrode of the circuit substrate according to the second embodiment of the present invention and the component is mounted on the circuit substrate.

In the present embodiment, the third layer 33 made of the first metal as the main material is exposed at the bottom of the recess 8. Accordingly, when the solder reaches the bottom of the recess 8, the solder can adhere to the third layer 33. The solder can spread out to the bottom of the recess 8, which enables more solder to move into the recess 8. In the present embodiment, the amount of solder changes the manner in which the solder 5 spreads out, for example, as illustrated in FIGS. 7, 8, and 9.

It is preferable that the third layer 33 be electrically connected to the multilayer body 10. A portion of the third layer 33 with which the solder is in contact is thereby enabled to serve as an electrical connection to the multilayer body 10. In this case, the third layer 33 can be regarded as part of the electrode, which leads to design flexibility for forming the electrode within the recess 8.

In FIGS. 6 to 9, a borderline is drawn between the first layer 31 and the third layer 33, which looks as if the both layers are formed separately. However, both layers either may be formed separately or may be formed integrally. This also applies to fourth and sixth embodiments, which will be described later.

Third Embodiment

A circuit substrate according to a third embodiment of the present invention will be described with reference to FIG. 10.

A circuit substrate 103 according to the present embodiment is similar in basic configuration to the circuit substrate 101 described in relation to the first embodiment except for the following points.

Figure 10:
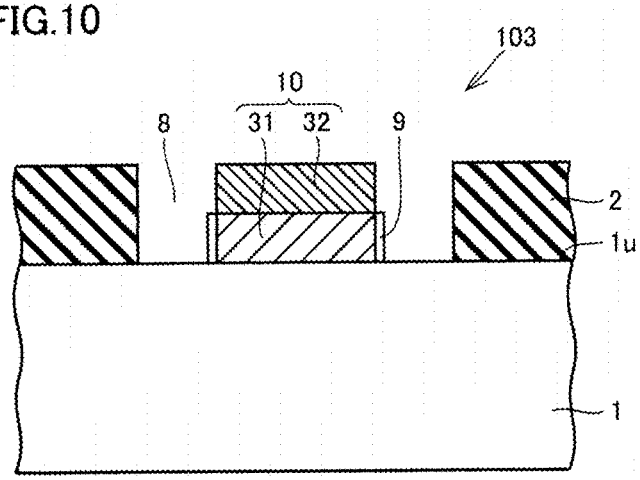
FIG. 10 is a partial cross-sectional view illustrating a circuit substrate according to a third embodiment of the present invention.

As illustrated in FIG. 10, at least the surfaces of the first layer 31 of the multilayer body 10 are covered with an antioxidant film 9. The antioxidant film 9 may be a film formed by prefluxing.

In the present embodiment, covering the surfaces of the first layer 31 with the antioxidant film 9 can prevent the first layer 31 from being oxidized. Accordingly, this can prevent a deterioration in solder wettability of the first layer 31.

Fourth Embodiment

Figure 11:
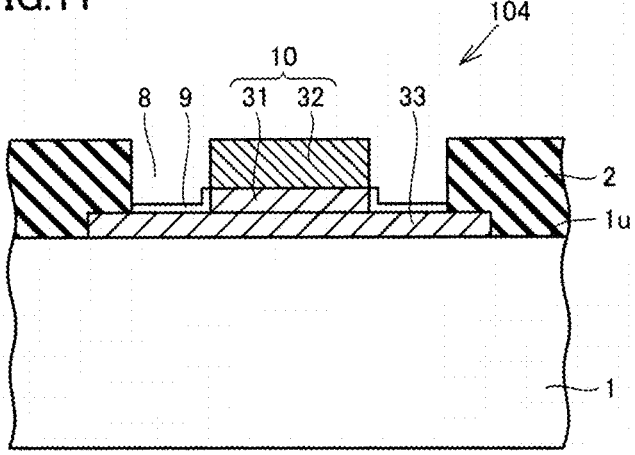
FIG. 11 is a partial cross-sectional view illustrating a circuit substrate according to a fourth embodiment of the present invention.

A circuit substrate according to a fourth embodiment of the present invention will be described with reference to FIG. 11. A circuit substrate 104 according to the present embodiment is similar in basic configuration to the circuit substrate 103 described in relation to the third embodiment except for the following points.

The circuit substrate 104 according to the present embodiment further includes the third layer 33 disposed at the bottom of the recess 8. In the circuit substrate 104, the surfaces of the first layer 31 of the multilayer body 10 are covered with the antioxidant film 9, and the surface of the third layer 33 is also covered with the antioxidant film 9.

In the present embodiment, the solder can spread out to the bottom of the recess 8, which enables more solder to move into the recess 8. In the present embodiment, covering the surfaces of the first layer 31 and the third layer 33 with the antioxidant film 9 can prevent the first layer 31 and the third layer 33 from being oxidized. Accordingly, this can prevent a deterioration in solder wettability of the first layer 31 and the third layer 33.

Fifth Embodiment

Figure 12:
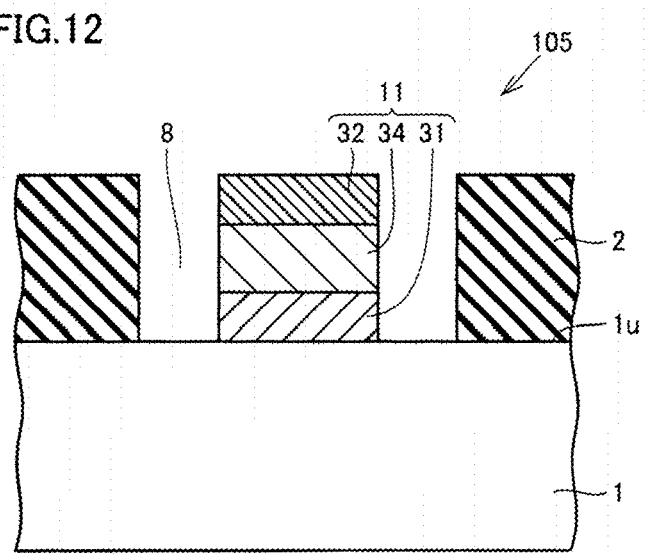
FIG. 12 is a partial cross-sectional view illustrating a circuit substrate according to a fifth embodiment of the present invention.

A circuit substrate according to a fifth embodiment of the present invention will be described with reference to FIG. 12. A circuit substrate 105 according to the present embodiment is similar in basic configuration to the circuit substrate 101 described in relation to the first embodiment except for the following points.

The circuit substrate 105 according to the present embodiment includes a multilayer body 11 in place of the multilayer body 10. The multilayer body 11 is an electrode. The multilayer body 11 further includes an intermediate layer 34 in addition to the first layer 31 and the second layer 32, and the intermediate layer 34 has an electric conductivity. The multilayer body 11 has such a structure that the first layer 31 overlies the substrate 1, the intermediate layer 34 overlies the first layer 31, and the second layer 32 overlies the intermediate layer 34. The first layer 31 is made of, for example, Cu. The second layer 32 is made of, for example, Au. The intermediate layer 34 is made of, for example, Ni.

The circuit substrate 105 includes the substrate 1 having the major surface 1u, the multilayer body 11 disposed on the major surface 1u, and the insulating layer 2 that covers the major surface 1u. As viewed perpendicular to the major surface 1u, the insulating layer 2 is disposed so as to be spaced from the multilayer body 11 and to surround the multilayer body 11. The multilayer body 11 includes the first layer 31 and the second layer 32 that overlies the first layer 31. The first layer 31 is made of the first metal as a main material, and the second layer 32 is made of the second metal as a main material. The second metal has a higher solder wettability than the first metal. The recess 8 is defined by, and formed between, the multilayer body 11 and the insulating layer 2. As described above, the multilayer body may include an additional layer in addition to the first and second layers. It is sufficient that the multilayer body is configured such that the second layer is positioned at least above the first layer. The additional layer may be interposed between the first and second layers.

As described in the present embodiment, even if the multilayer body includes a layer other than the first and second layers, advantageous effects similar to those described in the first embodiment can be obtained.

Sixth Embodiment

Figure 13:
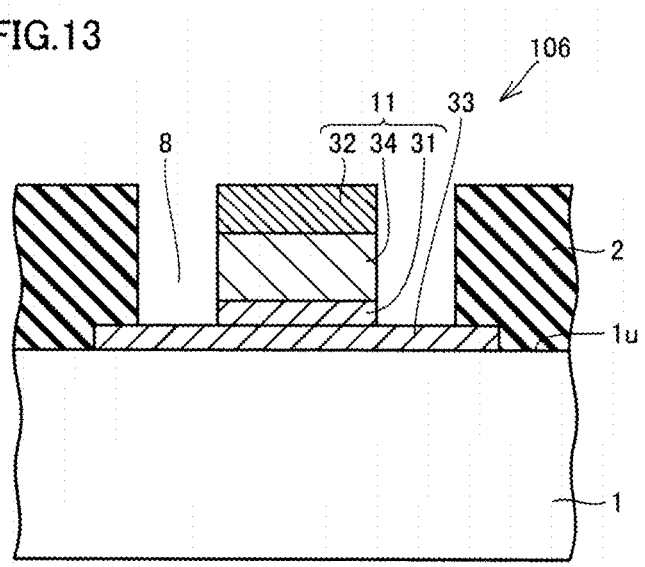
FIG. 13 is a partial cross-sectional view illustrating a circuit substrate according to a sixth embodiment of the present invention.

A circuit substrate according to a sixth embodiment of the present invention will be described with reference to FIG. 13. A circuit substrate 106 according to the present embodiment is similar in basic configuration to the circuit substrate 105 described in relation to the fifth embodiment except for the following points.

The circuit substrate 106 according to the present embodiment further includes the third layer 33 made of the first metal as a main material disposed at the bottom of the recess 8.

The present embodiment provides advantageous effects similar to those described in the second embodiment.

In the fifth and sixth embodiments, the multilayer body 11 has been described as having a three-layer structure. However, the multilayer body 11 may have a structure formed of four or more layers. For example, the intermediate layer 34 is not limited to a one-layer structure but may be constituted by two or more layers.

Note that the second metal is exemplified as Au, but the second metal is not limited to Au. The second metal may be one metal selected from the group consisting of Au, Pd, Pt, Sn, and Ag or may be two metals selected from the same group.

Note that the above embodiments may be combined appropriately. Also note that the embodiments disclosed herein are exemplary and are not limiting in all respects. The scope of the present invention is defined by the appended claims, and all of the equivalents and alterations without departing from the scope are to be included in the invention.

REFERENCE SIGNS LIST 1 substrate
1u major surface
2 insulating layer
5, 5a, 5b, 5c, 5d solder
8 recess
9 antioxidant film
10, 11 multilayer body (electrode)
20 component
21 component-side electrode
31 first layer
32 second layer 33 third layer
34 intermediate layer
101, 102 circuit substrate

The invention claimed is:

1. A circuit substrate comprising:
a substrate having a major surface;
a multilayer body on the major surface, the multilayer body including:
a first layer made of a first metal as a main material thereof,
a second layer made of a second metal as a main material thereof, the second layer overlying the first layer, and the second metal having a higher solder wettability than the first metal, wherein the first layer and the second layer have a rectangular shape as viewed perpendicular to the major surface of the substrate, and
a third layer made of the first metal as a main material thereof, the third layer positioned between the first layer and the major surface of the substrate and extending beyond side surfaces of the first layer; and
an insulating layer on the major surface, the insulating layer surrounding and spaced from a surface of the second layer as viewed perpendicular to the major surface such that a recess is defined between the multilayer body and the insulating layer and an entirety of a bottom portion of the recess between the multilayer body and the insulating layer is the third layer.

2. The circuit substrate according to claim 1, wherein the insulating layer surrounds and is spaced from the side surfaces of the first layer as viewed perpendicular to the major surface such that the recess is also defined between the first layer and the insulating layer.

3. The circuit substrate according to claim 1, wherein the first metal is Cu and the second metal is Au.

4. The circuit substrate according to claim 1, wherein each of the side surfaces of the first layer are located at a same position as a corresponding side surface of the second layer.

5. The circuit substrate according to claim 1, wherein the third layer is electrically connected to the first layer.

6. The circuit substrate according to claim 5, wherein the third layer is integral with the first layer.

7. The circuit substrate according to claim 1, further comprising an intermediate layer between the first layer and the second layer, the intermediate layer having electrical conductivity.

8. The circuit substrate according to claim 7, wherein the third layer is electrically connected to the first layer.

9. The circuit substrate according to claim 8, wherein the third layer is integral with the first layer.

10. The circuit substrate according to claim 7, further comprising an antioxidant film covering at least a surface of the first layer of the multilayer body.

11. The circuit substrate according to claim 10, wherein the antioxidant film further covers at least a surface of the third layer.

12. The circuit substrate according to claim 1, further comprising an antioxidant film covering at least a surface of the first layer of the multilayer body.

13. The circuit substrate according to claim 12, wherein the antioxidant film further covers at least a surface of the third layer.

* * * * *